(12) United States Patent
Snyder et al.

(10) Patent No.: US 10,934,936 B2
(45) Date of Patent: Mar. 2, 2021

(54) COOLING SYSTEM IN A HYBRID ELECTRIC PROPULSION GAS TURBINE ENGINE FOR COOLING ELECTRICAL COMPONENTS THEREIN

(71) Applicant: Rolls-Royce North American Technologies, Inc., Indianapolis, IN (US)

(72) Inventors: Douglas J. Snyder, Carmel, IN (US); Andrew M. Bollman, Plainfield, IN (US)

(73) Assignee: Rolls-Royce North American Technologies, Inc., Indianapolis, IN (US)

(*) Notice: Subject to any disclaimer, the term of this patent is extended or adjusted under 35 U.S.C. 154(b) by 781 days.

(21) Appl. No.: 15/645,346

(22) Filed: Jul. 10, 2017

(65) Prior Publication Data

US 2019/0010866 A1  Jan. 10, 2019

(51) Int. Cl.
*F02C 6/20* (2006.01)
*B64D 27/24* (2006.01)
(Continued)

(52) U.S. Cl.
CPC ............ *F02C 6/20* (2013.01); *B64D 27/10* (2013.01); *B64D 27/16* (2013.01); *B64D 27/24* (2013.01);
(Continued)

(58) Field of Classification Search
CPC ..... F02C 6/20; F02C 7/12; F02C 3/04; H02K 11/33; H02K 9/19; B64D 27/10;
(Continued)

(56) References Cited

U.S. PATENT DOCUMENTS 3,429,122 A    2/1969  Pravda et al.
4,608,819 A *  9/1986  Colman ................. F01D 17/02
                                                    361/690
(Continued)

FOREIGN PATENT DOCUMENTS

EP          2412939 A1 *  2/2012  ............. F01D 15/10

OTHER PUBLICATIONS

Kelly et al., "Assessment of Thermal Control Technologies for Cooling Electric Vehicle Power Electronics", Conference Paper NREL/CP-540-42267, Jan. 2008, 20 pgs.
(Continued)

*Primary Examiner* — Anatoly Vortman
(74) *Attorney, Agent, or Firm* — Shumaker & Sieffert, P.A.

(57) ABSTRACT

A cooling system is provided in a hybrid electric propulsion gas turbine engine for cooling electrical components therein. The cooling system includes an electrical component disposed in proximity to a power generation component in the hybrid electric propulsion gas turbine engine. The cooling system further includes a vapor chamber having an evaporator portion and a condenser portion, wherein the evaporator portion is disposed adjacent to and in thermal communication with the electrical component to transfer heat away from the electrical component. The vapor chamber includes biphasic working fluid therein that transitions between liquid and gaseous states as the working fluid flows proximal to the condenser portion and the evaporator portion respectively.

15 Claims, 5 Drawing Sheets

(51) Int. Cl.
*B64D 27/10* (2006.01)
*H05K 7/20* (2006.01)
*H02K 9/19* (2006.01)
*H02K 11/33* (2016.01)
*F02C 7/12* (2006.01)
*B64D 27/16* (2006.01)
*B64D 33/08* (2006.01)
*F02K 3/06* (2006.01)
*F02C 3/04* (2006.01)
*B64D 27/02* (2006.01)

(52) U.S. Cl.
CPC ............... *B64D 33/08* (2013.01); *F02C 7/12* (2013.01); *H02K 11/33* (2016.01); *H05K 7/20936* (2013.01); *B64D 2027/026* (2013.01); *F02C 3/04* (2013.01); *F02K 3/06* (2013.01); *F05D 2220/323* (2013.01); *H02K 9/19* (2013.01); *H05K 7/20309* (2013.01); *H05K 7/20318* (2013.01); *H05K 7/20327* (2013.01)

(58) Field of Classification Search
CPC ........ B64D 27/16; B64D 27/24; B64D 33/08; B64D 2027/026; F02K 3/06; F05D 2220/323; H05K 7/20309; H05K 7/20318; H05K 7/20327; H05K 7/20936
USPC ........................................... 361/688
See application file for complete search history.

(56) References Cited

U.S. PATENT DOCUMENTS

| | | | | |
|---|---|---|---|---|
| 5,411,077 | A * | 5/1995 | Tousignant | F28D 15/02 |
| | | | | 165/104.33 |
| 5,694,295 | A * | 12/1997 | Mochizuki | F28D 15/0233 |
| | | | | 361/699 |
| 6,076,595 | A | 6/2000 | Austin et al. | |
| 6,269,866 | B1 * | 8/2001 | Yamamoto | F28D 15/0233 |
| | | | | 165/104.26 |
| 6,810,946 | B2 | 11/2004 | Hoang | |
| 7,213,391 | B2 | 5/2007 | Jones | |
| 8,345,425 | B2 * | 1/2013 | Toyoda | F28D 1/05366 |
| | | | | 165/104.26 |
| 8,387,362 | B2 * | 3/2013 | Storage | F01D 25/125 |
| | | | | 60/226.1 |
| 8,424,285 | B2 | 4/2013 | Veilleux, Jr. | |
| 8,739,406 | B2 * | 6/2014 | Campbell | B23P 15/26 |
| | | | | 29/890.07 |
| 8,910,465 | B2 | 12/2014 | Snyder | |
| 9,157,328 | B2 | 10/2015 | Pope et al. | |
| 9,482,451 | B2 | 11/2016 | Vaisman et al. | |
| 9,587,561 | B2 | 3/2017 | Snyder et al. | |
| 9,765,694 | B2 * | 9/2017 | Storage | F02C 7/12 |
| 9,889,807 | B2 | 2/2018 | Siegel et al. | |
| 10,443,620 | B2 * | 10/2019 | Hoefler | F04D 29/56 |
| 2004/0020213 | A1 | 2/2004 | Jones | |
| 2005/0092469 | A1 | 5/2005 | Huang | |
| 2006/0042225 | A1 * | 3/2006 | Bruno | F02K 3/04 |
| | | | | 60/204 |
| 2007/0187072 | A1 | 8/2007 | Chin et al. | |
| 2007/0284090 | A1 | 12/2007 | Wu et al. | |
| 2008/0053060 | A1 * | 3/2008 | Olver | F02C 7/14 |
| | | | | 60/226.1 |
| 2008/0164010 | A1 | 7/2008 | Kang et al. | |
| 2008/0283223 | A1 | 11/2008 | Chang et al. | |
| 2010/0149755 | A1 | 6/2010 | Tomioka et al. | |
| 2010/0300656 | A1 | 12/2010 | Lu et al. | |
| 2011/0268562 | A1 | 11/2011 | Knight, III et al. | |
| 2013/0160974 | A1 | 6/2013 | Uchida | |
| 2013/0319016 | A1 * | 12/2013 | Fontanel | F01D 25/12 |
| | | | | 62/3.61 |
| 2014/0165570 | A1 | 6/2014 | Herring | |
| 2014/0246170 | A1 | 9/2014 | Snyder et al. | |
| 2014/0260340 | A1 | 9/2014 | Vaisman et al. | |
| 2014/0271116 | A1 * | 9/2014 | Snyder | F02C 7/14 |
| | | | | 415/1 |
| 2015/0047315 | A1 | 2/2015 | Snyder | |
| 2015/0305199 | A1 | 10/2015 | Yu | |
| 2016/0215696 | A1 * | 7/2016 | Snyder | F02C 7/12 |
| 2016/0305279 | A1 | 10/2016 | Gerstler et al. | |
| 2018/0023416 | A1 | 1/2018 | Riaz et al. | |
| 2018/0050810 | A1 | 2/2018 | Niergarth et al. | |
| 2019/0014687 | A1 * | 1/2019 | Snyder | H05K 7/20318 |
| 2019/0390603 | A1 * | 12/2019 | Snyder | H05K 7/2029 |

OTHER PUBLICATIONS http://norenproducts.com/industries/aerospace/; printed Jul. 11, 2017 (1 page).
http://norenproducts.com/products/heat-pipes/; printed Jul. 11, 2017 (2 pages).
http://www.sjsu.edu/people/nicole.okamoto/courses/me_146/FundamentalsofHeatPipesII.ppt; PowerPoint presentation "Fundamentals of Heat Pipes," SAIED, Widah, printed Jul. 11, 2017 (67 pages).
http://www.thermacore.com/products/loop-heat-pipes-and-loop-devices.aspx; printed Jul. 11, 2017 (1 page).
http://www.thermacore.com/applications/power-electronics-cooling.aspx; printed Jul. 11, 2017 (1 page).
http://www.1-act.com/loop-heat-pipe-design-manufacturing-and-testing-an-industrial-perspective/; Anderson, W.G. et al., printed Jul. 11, 2017 (11 pages).
http://webcache.googleusercontent.com/search?q=cache:http://file.scirp.org/Html/1-1520058_55065.htm&num=1&strip=1&vwsrc=0; Heat Pipe for Aerospace Applications—An Overview; Abstract, printed Jul. 11, 2017 (8 pages).
Shukla, K.N. (2015) Heat Pipe for Aerospace Applications—An Overview. *Journal of Electronics Cooling and Thermal Control*, 5, 1-14. http://dx.doi.org/10.4236/jectc.2015.51001; printed Jul. 12, 2017 (14 pages).
Maydanik, Yu. F., "Loop heat pipes", Applied Thermal Engineering 25 (2005) 635-657, *Institute of Thermal Physics*, Ekaterinburg, Russia, printed Jul. 14, 2017 (1 page).
https://www.1-act.com/resources/heat-pipe-fundamentals/different-types-of-heat-pipes/thermosyphons/lo . . . printed Jul. 19, 2017 (3 pages).
https://www.1-act.com/products/high-performance-power-electronics-coolers/ printed Jul. 19, 2017 (3 pages).
https://www.1-act.com/resources/heat-pipe-fundamentals/different-types-of-heat-pipes/ printed Jul. 19, 2017 (2 pages).
https://en.wikipedia.org/wiki/Heat_pipe#Diode_heat_pipes printed Jul. 20, 2017 (10 pages).
https://www.electronics-cooling.com/2003/05/an-introduction-to-pulsating-heat-pipes/ printed Jul. 19, 2017 (6 pages).
Singh, Miniature Loop Heat Pipe With Flat Evaporator for Cooling Computer CPU, IEEE Transactions on Components and Packaging Technologies, vol. 30, No. 1, Mar. 2007 (8 pages).

* cited by examiner

COOLING SYSTEM IN A HYBRID ELECTRIC PROPULSION GAS TURBINE ENGINE FOR COOLING ELECTRICAL COMPONENTS THEREIN

CROSS REFERENCE TO RELATED APPLICATIONS

Not applicable

REFERENCE REGARDING FEDERALLY SPONSORED RESEARCH OR DEVELOPMENT

Not applicable

SEQUENTIAL LISTING

Not applicable

FIELD OF DISCLOSURE

The present subject matter relates to gas turbine engines, and more particularly, to cooling systems in hybrid electric propulsion gas turbine engines.

BACKGROUND

In hybrid electric propulsion gas turbine engines of aircrafts, electric machines are utilized to assist in propulsion. Some electronics are associated with the electric machines to, for example, convert/condition electrical power from one form to another or to provide sensing and control functionality in connection with the electric machines. The electronics, for example, power electronics generate heat associated with the operation of the internal components therein. The internally generated heat should be removed so that the power electronics do not overheat. The electronics are in a hot environment that may adversely affect the operability of the electronics, and, as such, may increase the risk of failure of the hybrid electric propulsion gas turbine engine and the aircraft. Traditionally, in the automotive industry, cooling of electronics is accomplished with the use of ethylene glycol (EGW) or propylene glycol (PGW) coolants, where the EGW or PGW is pumped through a cold plate. The use of such coolants in hybrid electric propulsion gas turbine engines has certain drawbacks. For instance, the utilization of EGW and PGW adds extra weight to the system. Furthermore, when operated at high altitude, a pump would be required to circulate the coolants that will also add more weight to the system and add an additional power demand. Thus, there is a need to provide a cooling system to transfer heat away from the electronics in a hybrid electric propulsion gas turbine engine without the drawbacks associated with liquid fluids such as EGW and PGW.

SUMMARY

According to one aspect, a cooling system is provided in a hybrid electric propulsion gas turbine engine for cooling electrical components therein. The cooling system includes an electrical component disposed in proximity to an aircraft power generation component in the hybrid electric propulsion gas turbine engine. The cooling system further includes a vapor chamber having an evaporator portion and a condenser portion, wherein the evaporator portion is disposed adjacent to and in thermal communication with the electrical component to transfer heat away from the electrical component. The vapor chamber includes biphasic working fluid therein that transitions between liquid and gaseous states as the working fluid flows proximal to the condenser portion and the evaporator portion respectively.

According to another aspect, a method of cooling electrical components in a hybrid electric propulsion gas turbine engine is provided. The method of cooling comprises disposing an electrical component in proximity to an aircraft power generation component in the hybrid electric propulsion gas turbine engine, providing a vapor chamber adjacent to the electrical component, wherein the vapor chamber comprises a condenser portion and an evaporator portion, and transferring heat away through thermal communication from the electrical component via the vapor chamber, wherein the vapor chamber includes biphasic working fluid therein that transitions between liquid and gaseous states as the working fluid flows proximal to the condenser portion and the evaporator portion respectively.

DETAILED DESCRIPTION

Figure 1:
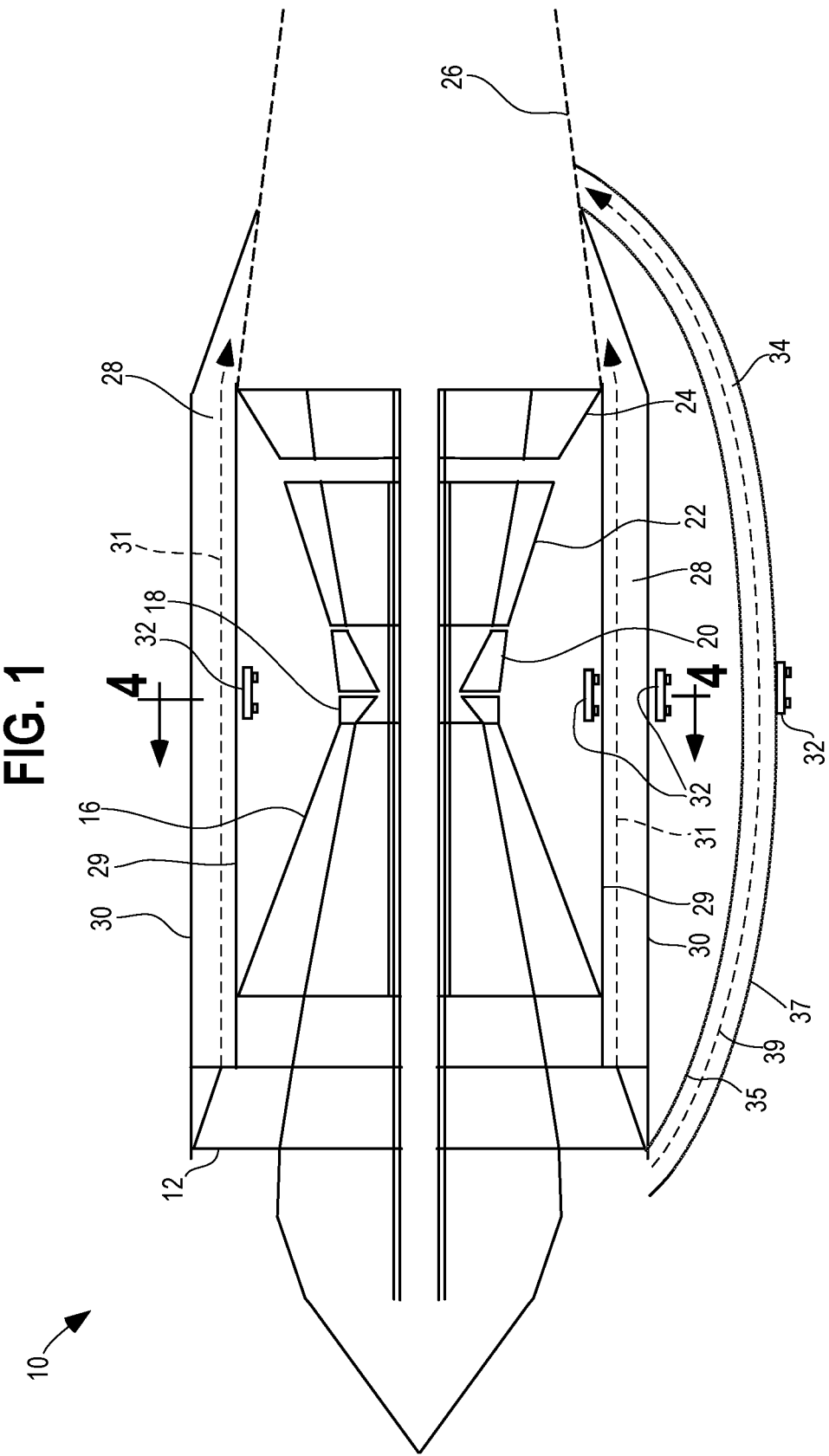
FIG. 1 schematically illustrates an embodiment of a hybrid electric propulsion gas turbine engine.

In the embodiments disclosed herein, specifically a cooling system in a form of a vapor chamber is used in a hybrid electric propulsion gas turbine engine of an aircraft to transfer heat away from electrical components disposed therein. Examples of electrical components that may selectively be utilized include power electronics, control electronics, and/or sensor electronics. Air is used, instead of EGW and PGW, as a cooling medium for the electrical components in the hybrid electric propulsion gas turbine engine. A source of air may, for example, be a fan stream air flowing through a fan duct of the hybrid electric propulsion gas turbine engine. The fan stream air functions as a heat sink in connection with the vapor chambers. It should be noted that other sources of air such as ram air may be utilized to provide the effect of the heat sink in the embodiments disclosed herein. Referring to the drawings, and more specifically to FIG. 1, an example of a hybrid electric propulsion gas turbine engine is schematically illustrated. The hybrid electric propulsion gas turbine engine 10 is an aircraft propulsion power plant in a form of a turbofan engine. The hybrid electric propulsion gas turbine engine 10 includes a fan 12, a compressor 16, a diffuser 18, a combustor 20, a high pressure turbine 22, a low pressure turbine 24, an exhaust nozzle 26, a bypass fan duct 28, a ram air duct 34, and vapor chambers 32 (described below) that may be disposed in alternative locations. The bypass fan duct 28 (hereinafter referred to as fan duct) has an inner wall 29 and an outer wall 30, which define the volume inside the fan duct 28. A fan stream air 31 supplied by fan 12 flows through the fan duct 28. Also, the ram air duct 34 has a ram duct wall 37, which defines the volume inside the ram air duct 34. Ram stream air 39 is supplied through the ram air duct 34.

Figure 2:
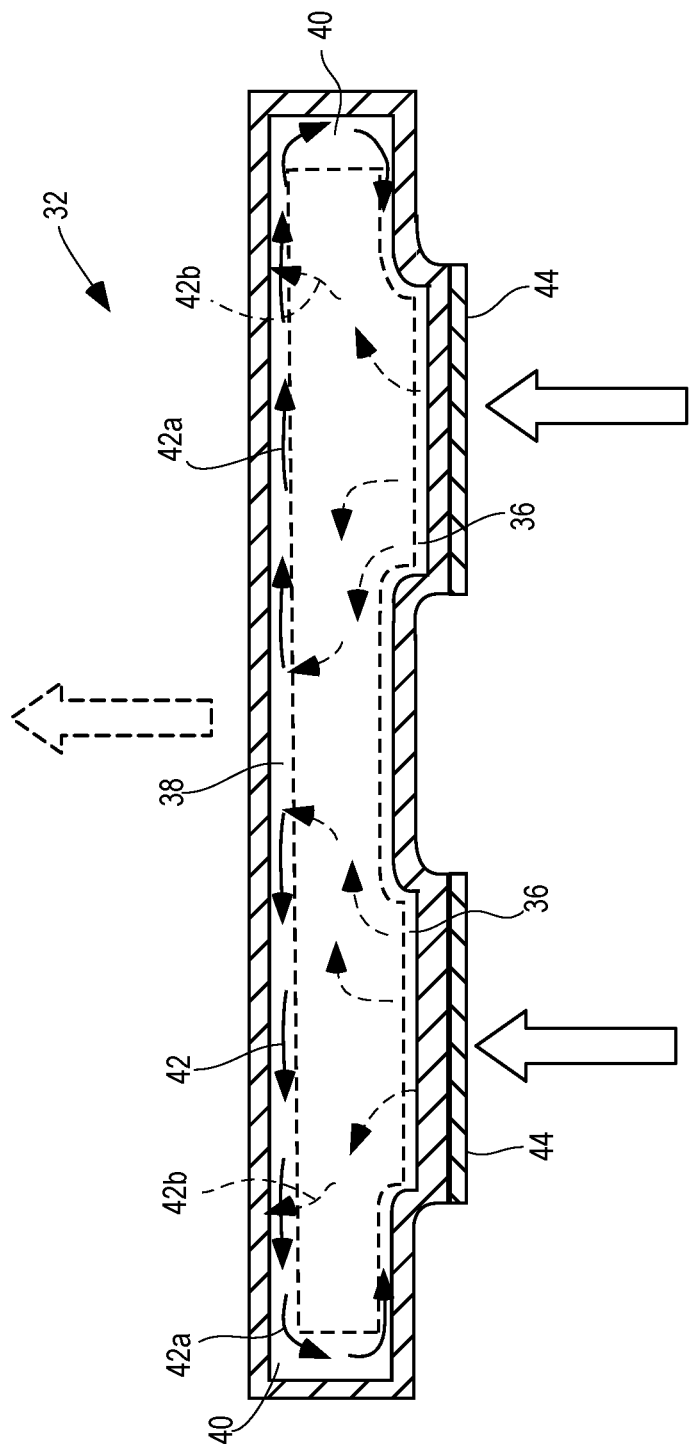
FIG. 2 schematically illustrates an embodiment of a vapor chamber disposed adjacent to electrical components.

An example embodiment of a vapor chamber is shown schematically in FIG. 2. The vapor chamber 32 in this example comprises an evaporator portion 36, condenser portion 38, channel 40, and biphasic working fluid 42. The evaporator portion 36 is disposed adjacent or attached to one or more electrical component(s) 44. In operation, the working fluid 42 that is disposed within the vapor chamber 32 is circulated between the condenser portion 38 and the evaporator portion 36. The working fluid 42 may be water, ammonia, and a variety of refrigerants known to one of ordinary skill in the art. The working fluid 42 in the condenser portion 38 is in liquid state 42a (shown as arrows with solid tails) and travels through the channel 40 to the evaporator portion 36. The evaporator portion 36 is in thermal communication with a hot object (e.g. heat transfer object) such as the electrical component(s) 44, which may be in the form of electronics. Heat from the hot object is transferred through the wall of the vapor chamber 32 by conduction. Once the heat reaches the working fluid 42 inside the vapor chamber 32, the working fluid in the liquid state 42a vaporizes. The heat load from the heat transfer object is transferred to the evaporator portion 36 and causes the working fluid 42 to evaporate and flow as a working fluid in gaseous state 42b (shown as arrows with dashed tails) toward the condenser portion 38. The working fluid in the gaseous state 42b in a form of vapor enters the condenser portion 38 and condenses back to the liquid state 42a and, as such, one of the repeating cycles in the circulation is completed. The condensation of the working fluid 42 to the liquid state 42a is accomplished by another heat transfer effect from the condenser portion 38 to a heat sink (described below). The working fluid in the liquid state 42a in the condenser portion 38 may be wicked back to the evaporator portion 36, drip as droplets back onto the evaporator portion 36, or flow in the channel 40 toward the evaporator portion 36. The temperature of the liquid/vapor mixture in the vapor chamber 32 is nearly isothermal because the pressure within the vapor chamber 32 is nearly uniform. This isothermal condition occurs because boiling/evaporation occur at a fixed temperature for a given pressure. Therefore, significant amounts of heat can be transferred within a vapor chamber 32 with negligible temperature gradient throughout the vapor chamber 32. There is a temperature drop due to conduction when heat is transferred through the vapor chamber 32 wall from the electronics. A temperature drop also occurs as heat is transferred through the vapor chamber 32 wall at the condenser portion 38.

Figure 3:
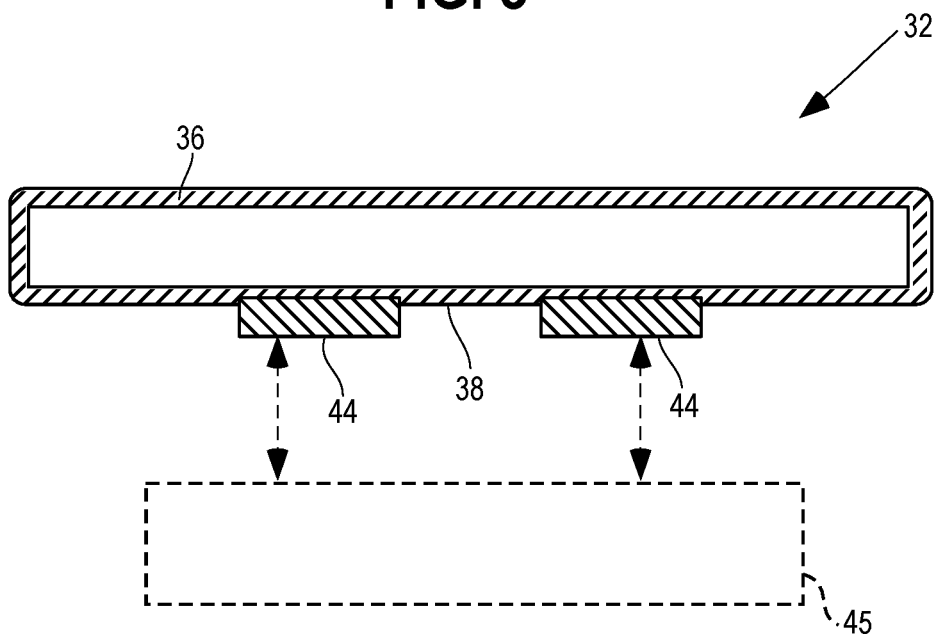
FIG. 3 schematically illustrates an enlarged, elevational view of an example embodiment of a combination of the vapor chamber and the associated electrical components in the hybrid electric propulsion gas turbine engine.
Figure 4:
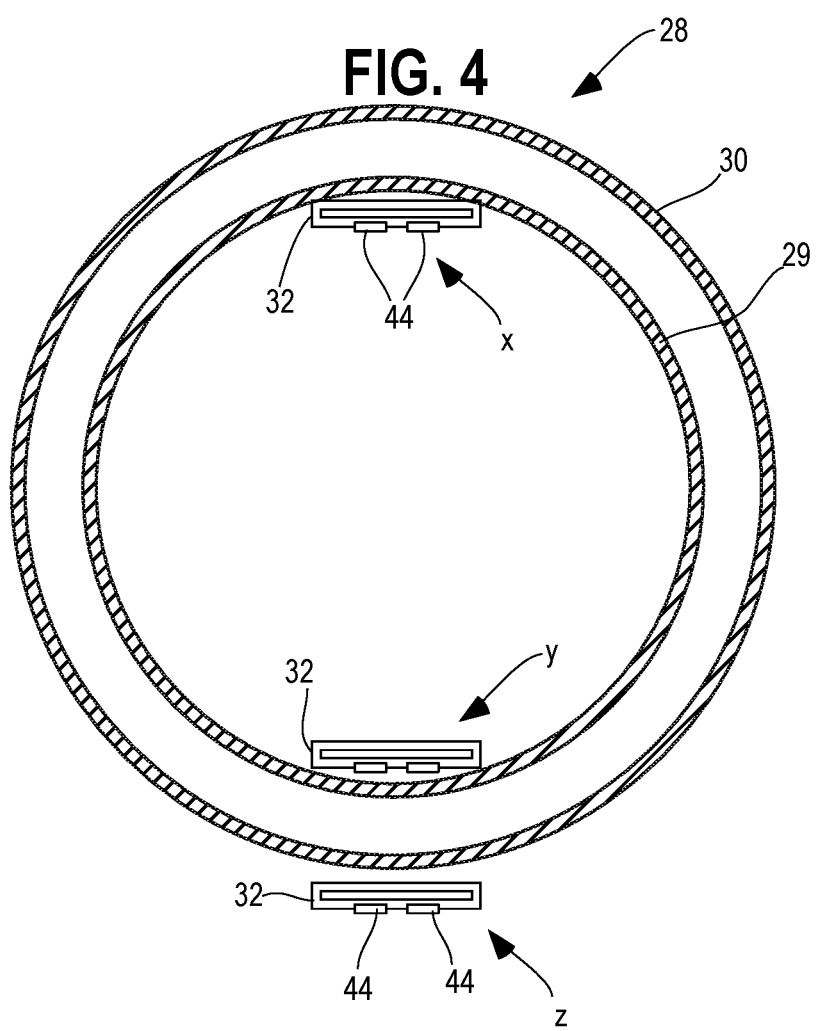
FIG. 4 is an enlarged, cross-sectional view of the embodiment of the vapor chamber and the electrical components along line 4-4 in FIG. 1 illustrating a number of locations for disposition of the vapor chamber and the electrical components.

Referring to FIG. 3, an enlarged, elevational view of an example embodiment of a combination of vapor chamber 32 and the associated electrical components 44 is represented. The aforementioned combination may be disposed in alternative locations with respect to the inner wall 29 or the outer wall 30 of the fan duct 28. In operation, the electrical components 44 are disposed in proximity to an aircraft power generation component 45 in the hybrid electric propulsion gas turbine engine such that the electrical components 44 may be thermally heated by the aircraft power generation component 45 or other hot structure. It should be noted that during operation the electrical components 44 self-generate heat loads internally that emanate from electronic elements disposed inside the electrical components 44. The fan duct 28 provides the fan stream air 31, which has an effect of a heat sink and transports heat fluxes away from the condenser portion 38 of the vapor chamber 32. Referring to FIG. 4, a number of locations for the disposition of the combination of the vapor chamber 32 and the electrical components 44 relative to the inner wall 29 and the outer wall 30 of the fan duct is shown. The inner wall 29 and the outer wall 30 of the fan duct 28 define a substantially annular ring. Depending on where the combination of the vapor chamber 32 and the electrical components 44 are disposed, a different embodiment of a modified structural configuration of the vapor chamber 32, the inner wall 29, and the outer wall 30 may be provided as described below. As shown in FIG. 4, the combination of the vapor chamber 32 and electrical components 44 may be disposed, for example, at locations X, Y, or Z relative to the inner wall 29 and outer wall 30 of the fan duct 28. The combination of the vapor chamber 32 and electrical components 44 may be selectively employed at other locations. In the example embodiments disclosed below, the electrical components 44 and the vapor chamber 32 are in thermal communication.

Figure 5:
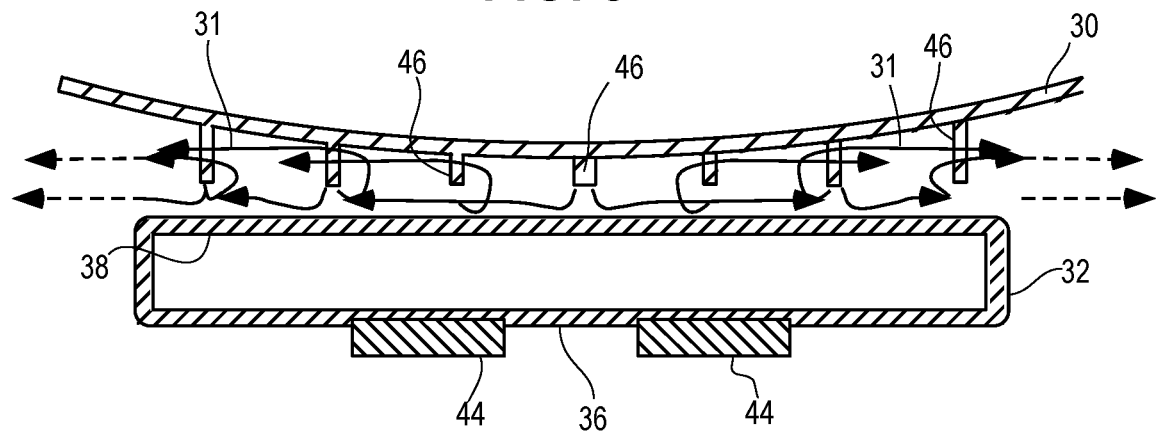
FIG. 5 is an enlarged, fragmentary view of another embodiment of the vapor chamber and the electrical components located externally relative to a structurally modified configuration of an outer wall of a fan duct in the hybrid electric propulsion gas turbine engine.

Referring to FIG. 5, an example embodiment of the vapor chamber 32 and the modified structural configuration of the outer wall 30 is shown. In this embodiment, the combination of the vapor chamber 32 and the electrical components 44 are disposed at location Z (See FIG. 4) in relation to the fan duct 28; however, in an alternative physical arrangement, the combination of the vapor chamber 32 and the electrical components 44 may be disposed at location X (See FIG. 4). In this embodiment, the condenser portion 38 is disposed external to the outer wall 30. As seen in FIG. 5, one or more access aperture(s) 46 provided in the outer wall 30 supply the fan stream air 31 to the outside of the fan duct 28 structure. The condenser portion 38 is proximal to and disposed in the path of the fan stream air 31, whereas the electrical components 44 are distal from the path of the stream air 31. The fan stream air 31 pours and impinges onto the condenser portion 38 of the vapor chamber 32 in a continuous manner. This continuous stream of air onto the condenser portion 38 of the vapor chamber 32 removes the heat released by the condensing vapor in the condenser portion 38. The vapor chamber 32 and the fan stream air 31 are in thermal communication, therefore, heat is removed from the vapor chamber 32 and the temperature of the vapor chamber 32 is maintained at an acceptable low level, for example, at substantially the temperature of the fan air stream 31. It should be noted that in the example embodiments disclosed herein as the surface area of the vapor chamber 32 in communication with the fan stream air 31 is increased, a lower heat transfer coefficient and smaller difference in temperature is required to maintain the temperature of the electrical components 44 at a desired level close to the temperature of the fan stream air 31. This follows a heat transfer equation that states: $Q = h \times A (T \text{ hot} - T \text{ cold})$, where (Q) is the heat transferred to the fluid, (h) is the heat transfer coefficient, (A) is the surface area of an object/medium, and (T hot–T cold) is the difference in temperature between the objects and the cooler fluid that are in thermal communication with each other.

Figure 6:
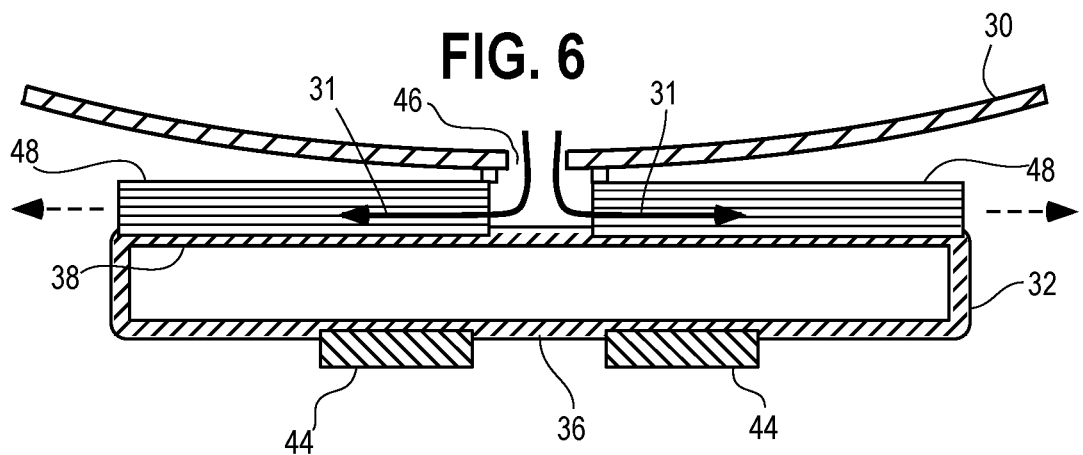
FIG. 6 is an enlarged, fragmentary view of another embodiment of another structurally modified configuration of the outer wall of the fan duct and the vapor chamber with microchannels and electrical components in the hybrid electric propulsion gas turbine engine.

Referring to FIG. 6, another embodiment of a structurally modified vapor chamber 32 and the outer wall 30 is shown. In this embodiment, the combination of the vapor chamber 32 and the electrical components 44 are disposed at location Z in relation to the fan duct 28 (See FIG. 4); however, in an alternative physical arrangement, the combination of the vapor chamber 32 and the electrical components 44 may be disposed at location X (See FIG. 4). In this example embodiment, one or more microchannel(s) 48 are attached to and spread across the surface area of condenser portion 38 of the vapor chamber 32. The microchannels 48 are very small passages in a form of small channels for the air to flow through. These small channels enable relatively high heat transfer coefficients as the flow passages become smaller. The microchannels 48 also enable very high heat transfer surface areas per volume. There are various approaches of creating microchannels such as etching and diffusion bonding of metal sheets, additive layer manufacturing, or other approaches known to one skilled in the art. The fan stream air 31 is introduced into the microchannels 48 through the access aperture 46 in the outer wall 30 of the fan duct 28. The fan stream air 31 passes through the microchannels and because of heat transfer effect removes the heat released from condensation of the vapor and, therefore, maintains the vapor chamber 32 temperature near the temperature of the fan stream air 31. The plurality of microchannels 48 provide an increase in the surface area and heat transfer coefficient as the fan stream air 31 passes through the microchannels 48. A larger surface area and heat transfer coefficient for the heat transfer from the vapor chamber 32 to the fan stream air 31 allows vapor chamber 32 to operate close to the fan stream air 31 temperature.

Figure 7:
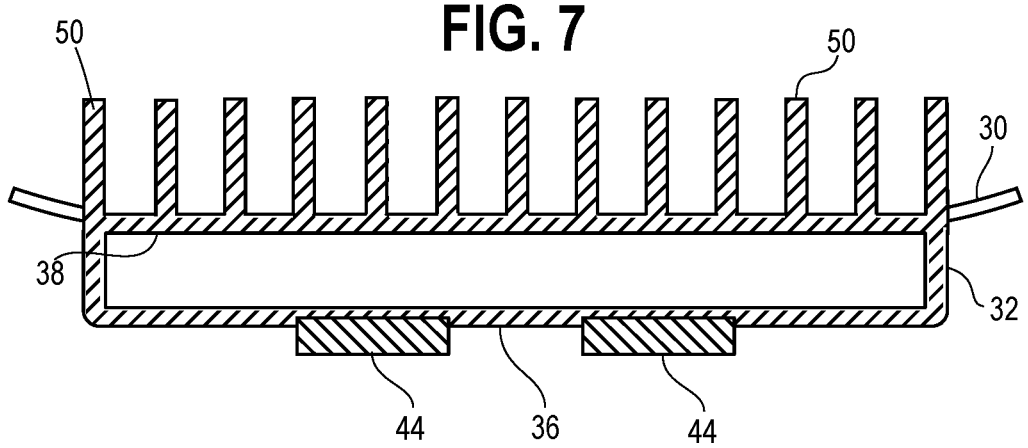
FIG. 7 is an enlarged, fragmentary view of another embodiment of another structurally modified configuration of the outer wall of the fan duct and the vapor chamber with fins and electrical components in the hybrid electric propulsion gas turbine engine.

Referring to FIG. 7, another embodiment of a structurally modified vapor chamber 32 and the outer wall 30 is shown. In this embodiment, the combination of the vapor chamber 32 and the electrical components 44 are disposed at location Z in relation to the fan duct 28 (See FIG. 4). As seen, in this example embodiment, one or more cooling fin(s) 50 are integral with or attached to the surface area of condenser portion 38 of the vapor chamber 32. Furthermore, the outer wall 30 of the fan duct 28 is structurally modified such that the condenser portion 38 of the vapor chamber 32 is disposed substantially contiguous with the outer wall 30 of the fan duct 28. The fins 50 intrude into the path of the fan stream air 31 thereby transferring heat from the vapor chamber 32 to the fan stream air 31 flowing through the fan duct 28. In an alternative circumstance where the combination of the vapor chamber 32 and electrical components 44 are disposed at location X (See FIG. 4), then the condenser portion 38 is contiguous with the inner wall 29 of the fan duct 28 and the fins 50 intrude into the fan duct 28 through the inner wall 29. The fins 50 may be axially aligned in the direction of the fan stream air 31. In an alternative embodiment, the combination of the vapor chamber 32 and the electrical components 44 may be disposed at a location outboard of the ram air duct 34 as shown in FIG. 1. Similar to the structurally modified condenser portion 38 shown in FIG. 7, one or more cooling fin(s) 50 are integral with or attached to the surface area of condenser portion 38 of the vapor chamber 32 in this alternative embodiment. Also similar to the structurally modified outer wall 30 of the fan duct 28 shown in FIG. 7, the ram duct wall 37 may be structurally modified such that the condenser portion 38 of the vapor chamber 32 is disposed substantially contiguous with the ram duct wall 37 and the fins 50 intrude into the path of the ram stream air 39. Hence, in this alternative embodiment, the ram stream air 39 flowing through the ram air duct 34 transfers heat away from the fins 50 associated with the condenser portion 38 of the vapor chamber 32. The fins 50 may be axially aligned in the direction of the ram stream air 39.

Figure 8:
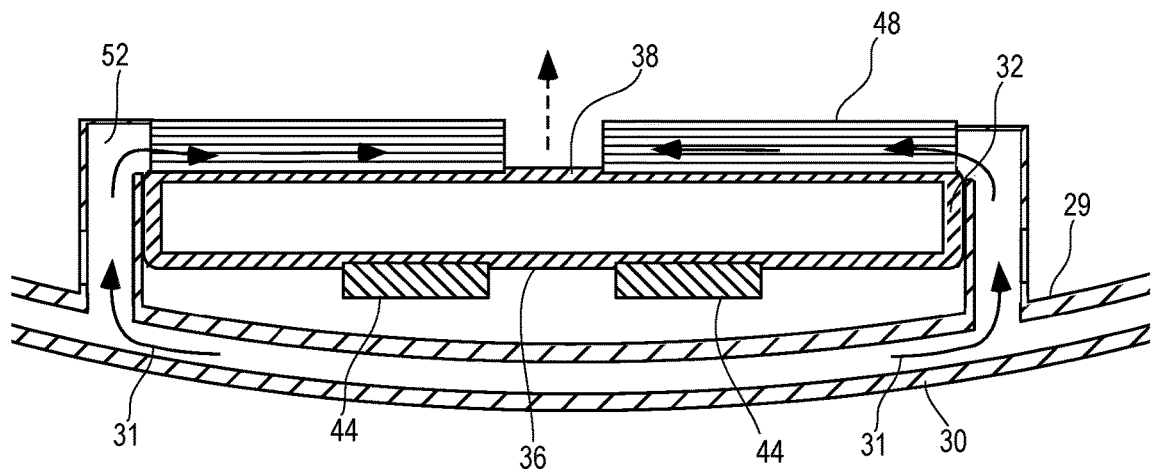
FIG. 8 is an enlarged, fragmentary view of another embodiment of a structurally modified configuration of the inner wall of the fan duct and the vapor chamber with microchannels and electrical components in the hybrid electric propulsion gas turbine engine.

Referring to FIG. 8, another embodiment of a structurally modified vapor chamber 32 and the inner wall 29 is shown. In this embodiment, the combination of the vapor chamber 32 and the electrical components 44 are disposed at location Y in relation to the fan duct 28 (See FIG. 4). In this example embodiment, one or more microchannel(s) 48 are attached to and spread across the surface area of the condenser portion 38 of the vapor chamber 32. The condenser portion 38 is distal from the inner wall 29 and the electrical components 44 are proximal to the inner wall 29. As seen, in this embodiment, the vapor chamber 32 is structurally modified to allow the fan stream air 31 to reach the microchannel(s) 48 that are distal from the inner wall 29. Inner wall air supply channels 52 are provided that supply the fan stream air 31 through the access apertures 46 in the inner wall 29 to the microchannel(s) 48.

Figure 9:
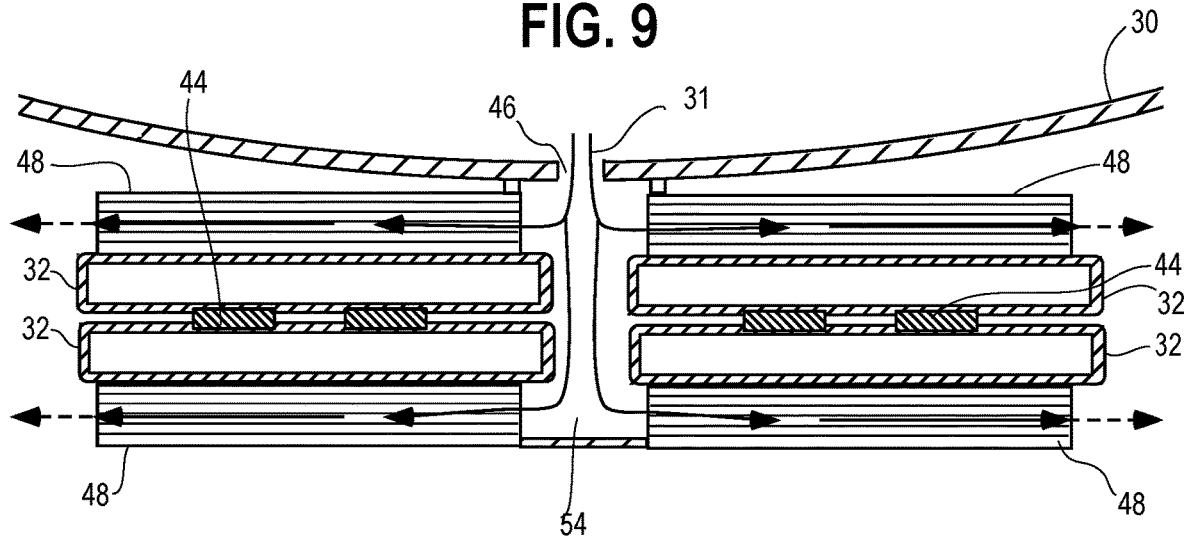
FIG. 9 is an enlarged, fragmentary view of another embodiment of another structurally modified configuration of the outer wall of the fan duct and the vapor chamber with microchannels and electrical components in the hybrid electric propulsion gas turbine engine.

Referring to FIG. 9, another embodiment of the structurally modified outer wall 30 and the combination of vapor chambers 32 and electrical components 44 are shown. In this embodiment, the electrical components 44 are sandwiched between separate evaporator portions 36 of respective separate vapor chambers 32. In this configuration, the electrical components 44 are, therefore, allowed twice the heat transfer capability because the two separate evaporator portions 36 contact at least two sides of each of the electrical components 44. The fan stream air 31 enters an outer wall air supply channel 54 through the access aperture 46 in the outer wall 30. Similar to the embodiment described in FIG. 8, the surface area of the condenser portion 38 of each of the vapor chambers 32 has one or more microchannels 48 disposed thereon. The fan stream air 31 traverses the microchannels 48 and removes the heat flux from the electrical components 44 through the condenser portion 38 of each of the vapor chambers 32 associated with electrical components 44. Furthermore, the microchannels 48 may be replaced with fins to provide area enhancement features for heat transfer. It should be noted that in the embodiments described above, the vapor chamber 32 need not be planar and the electrical components 44 may have different heights and thicknesses and, as such, the vapor chamber 32 may conform to the electrical components of different heights and thicknesses.

Other embodiments of cooling systems in hybrid electrical propulsion gas turbine engines are disclosed in a U.S. application Ser. No. 15/645,490 , entitled: "Cooling System in Hybrid Electric Propulsion Gas Turbine Engine" (Rolls-Royce docket No. LWA11864US), filed on Jul. 10, 2017, owned by the assignee of the present application, the content of which is incorporated by reference in its entirety in the present application.

INDUSTRIAL APPLICABILITY

As provided herein, the cooling system may be employed in connection with electrical components, and more specifically electrical components intended to be used in a hybrid electric propulsion gas turbine engine. The use of the terms "a" and "an" and "the" and similar references in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Numerous modifications to the present disclosure will be apparent to those skilled in the art in view of the foregoing description. It should be understood that the illustrated embodiments are exemplary only, and should not be taken as limiting the scope of the disclosure.

We claim:

1. A cooling system in a hybrid electric propulsion gas turbine engine for cooling an electrical component therein, the cooling system comprising:
   the electrical component disposed in proximity to an aircraft power generation component in the hybrid electric propulsion gas turbine engine; and
   a vapor chamber comprising an evaporator portion and a condenser portion, wherein a fan stream air is directed out of at least one access aperture in at least one of an outer wall or an inner wall of a fan duct to impinge onto the condenser portion and cool the working fluid to the liquid state, wherein the evaporator portion is disposed adjacent to and in thermal communication with the electrical component to transfer heat away from the electrical component, and wherein the vapor chamber includes biphasic working fluid therein that transitions between liquid and gaseous states as the working fluid flows proximal to the condenser portion and the evaporator portion respectively.

2. The cooling system of claim 1, wherein the electrical component comprises at least one of power electronics, control electronics, and sensor electronics.

3. The cooling system of claim 1, wherein the condenser portion is proximal to and disposed in a path of the fan stream air, and wherein the electrical component is distal from the path of the fan stream air.

4. The cooling system of claim 1, wherein the condenser portion comprises at least one microchannel, and wherein the at least one microchannel is configured to receive the fan stream air to cool the condenser portion.

5. The cooling system of claim 1, wherein the condenser portion of the vapor chamber is disposed substantially contiguous with at least one of an outer wall and inner wall of a fan duct supplying the fan stream air therethrough.

6. The cooling system of claim 5, wherein the condenser portion of the vapor chamber comprises at least one cooling fin, and wherein the cooling fin intrudes into the path of the fan stream air and is configured to transfer heat to the fan stream air.

7. The cooling system of claim 1, wherein the condenser portion is disposed external to the at least one of the outer wall and inner wall of the fan duct.

8. The cooling system of claim 1, wherein the vapor chamber is disposed outside of a substantially annular ring defined by the outer wall of the fan duct, and wherein the condenser portion is proximal to the at least one access aperture in the outer wall of the fan duct.

9. The cooling system of claim 1, wherein the condenser portion comprises at least one microchannel, wherein the at least one microchannel is configured to receive the fan stream air to cool the condenser portion, wherein the vapor chamber is disposed outside of a substantially annular ring defined by the outer wall of the fan duct, and wherein the condenser portion is proximal to the at least one access aperture in the outer wall of the fan duct.

10. A method of cooling an electrical component in a hybrid electric propulsion gas turbine engine, the method comprising:
    disposing the electrical component in proximity to an aircraft power generation component in the hybrid electric propulsion gas turbine engine;
    providing a vapor chamber adjacent to the electrical component, wherein the vapor chamber comprises a condenser portion and an evaporator portion, wherein the vapor chamber includes biphasic working fluid therein that transitions between liquid and gaseous states as the working fluid flows proximal to the condenser portion and the evaporator portion respectively;
    transferring heat away through thermal communication from the electrical component to the working fluid in the liquid state via the vapor chamber; and
    supplying, to the condenser portion, a fan stream air directed out of at least one access aperture in at least one of an outer wall or an inner wall of a fan duct to cool the working fluid in the gaseous state to the liquid state.

11. The method of claim 10, wherein the method further comprises disposing the condenser portion proximal to and in a path of the fan stream air, wherein the electrical component is distal from the path of the fan stream air.

12. The method of claim 11, wherein the condenser portion comprises at least one microchannel, and wherein the method further comprises flowing the fan stream air through the microchannel to cool the condenser portion.

13. The method of claim 11, wherein the method further comprises disposing the condenser portion of the vapor chamber substantially contiguous with a wall of a fan duct, wherein the condenser portion of the vapor chamber comprises at least one cooling fin, and wherein supplying the fan stream air comprises supplying, to the at least one cooling fin, the fan stream air to transfer heat from the at least one cooling fin to the fan stream air.

14. The method of claim 11, wherein the method further comprises disposing the condenser portion external to at least one of an outer wall and inner wall of a fan duct.

15. The method of claim 11, wherein the method further comprises disposing the vapor chamber outside of a substantially annular ring defined by an outer wall of a fan duct, wherein condenser portion is proximal to the at least one access aperture in the outer wall of the fan duct.

* * * * *